United States Patent

[11] 3,571,758

[72] Inventor Henry F. DeFrancesco
McLean, Va.

[21] Appl. No. 638,149
[22] Filed May 12, 1967
[45] Patented Mar. 23, 1971
[73] Assignee Westinghouse Electric Corporation
Pittsburgh, Pa.

[54] METHOD AND APPARATUS FOR ADAPTIVE DELTA MODULATION
12 Claims, 6 Drawing Figs.

[52] U.S. Cl. .......... 332/11, 340/347
[51] Int. Cl. .......... H03k 13/22
[50] Field of Search .......... 340/347; 325/38.1; 332/11 (D)

[56] References Cited

UNITED STATES PATENTS

| | | | |
|---|---|---|---|
| 3,189,891 | 6/1965 | Karsch | 340/347 |
| 3,216,003 | 11/1965 | Funk | 340/347 |
| 3,422,424 | 1/1969 | Belet | 340/347 |
| 3,461,244 | 8/1969 | Brolin | 325/38.1 |
| 2,662,113 | 12/1953 | Schouten | 325/38.1 |

*Primary Examiner*—Maynard R. Wilbur
*Assistant Examiner*—Jeremiah Glassman
*Attorneys*—F. H. Henson and E. P. Klipfel

ABSTRACT: Method and apparatus to improve delta modulation wherein the direction of the analogue input signal to be approximated in digital form for transmission is compared with the difference between the analogue input signal and an integrated copy of the digital approximation to adaptively select the amplitude of the transmitted pulses to better follow high frequency excursions in the analogue input signal.

WITNESSES

Theodore F. Wrobel

James F. Young

INVENTOR

Henry F. De Francesco

BY Ernest P. Klipfel

ATTORNEY

| A | A−D | E |
|---|---|---|
| + | + | 1,1 |
| + | − | −1 |
| − | + | +1 |
| − | − | −1,−1 |

METHOD AND APPARATUS FOR ADAPTIVE DELTA MODULATION

FIELD OF THE INVENTION

The present invention relates generally to method and apparatus for delta modulation and more particularly relates to a method and apparatus for improving the performance of delta modulation by selecting output pulses of an amplitude to better match the frequency characteristics and dynamic range of the analogue input signal.

DESCRIPTION OF THE PRIOR ART

The usual apparatus and method of delta modulating an analogue input signal compares the analogue input signal with an integrated copy of the digital approximation transmitted. The transmitted digital approximation is usually in the form of a single pulse which changes polarity or sign in accordance with changes of the analogue input signal. Only the changes in amplitude of the input signal from sampling instant to sampling instant are transmitted. Basic delta modulation uses a code of only one digit as contrasted with pulse coded modulation wherein a binary code of a number of digits is used to transmit a digital approximation of a varying analogue signal. While delta modulation is more simply implemented than pulse coded modulated the selection of the amplitude of the digit or pulse to be transmitted to most faithfully reproduce the input signal is extremely difficult. The quantization noise resulting from the difficulty of a unit pulse following an analogue input signal of wide frequency excursions can result in the transmitted digital approximation leading or lagging the analogue input signal to an extent that a poor reproduction of the analogue input signal is obtained. Such poor reproduction can result for example in sandiness in a speech signal which is transmitted.

Variations of delta modulation seek to overcome the difficulties in faithfully reproducing a varying analogue input signal in digital form. All entail considerably more circuitry and complications than the method and apparatus of the present invention.

Accordingly, an object of the present invention is to provide method and apparatus for reducing the quantization noise in a delta modulation system while retaining most of its advantages.

Another object of the present invention is to provide method and apparatus for delta modulation wherein the amplitude of the sample pulse can be selected adaptively to better follow high frequency excursions in the waveform under modulation.

Another object of the present invention is to provide method and apparatus for delta modulation wherein greater freedom is allowed in selecting the best combination of sampling frequency and pulse amplitude to match the frequency characteristics and dynamic range of the input signal.

SUMMARY OF THE INVENTION

Briefly, the present invention accomplishes the above-cited objects by providing method and apparatus for improving a delta modulation system by comparing the direction of the input signal to be modulated with the difference between the input signal and an integrated copy of the output pulses digitally approximating the input signal to determine whether the input signal is moving towards or away from the pulse coded or digital output approximation. When the analogue signal being modulated is moving away from its digital approximation being transmitted, the magnitude of the digital approximation is increased by doubling the amplitude of the transmitted pulse. Alternatively, a pair of pulses of proper polarity may be transmitted when the input signal is determined to be moving away from the digital approximation thereof. Such determination is made by determining the direction to the input signal and utilizing the logic technique for checking the direction of such input signal with the relative magnitude of the input signal and its digital approximation.

BRIEF DESCRIPTION OF THE DRAWING

Further objects and advantages of the present invention will readily be apparent from the following detailed description taken in conjunction with the drawings in which.

DESCRIPTION OF THE PREFERRED EMBODIMENT

Figure 1:
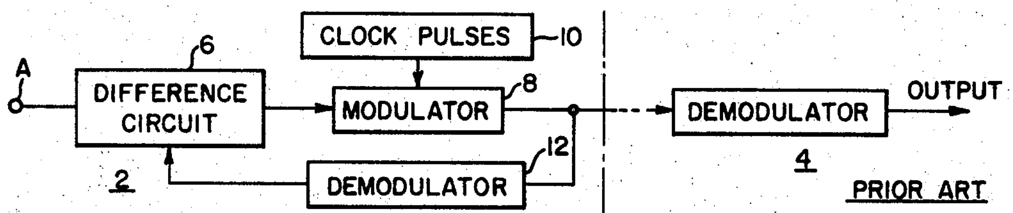
FIG. 1 is a schematic block diagram of a delta modulation system in accordance with the prior art.
Figure 2:
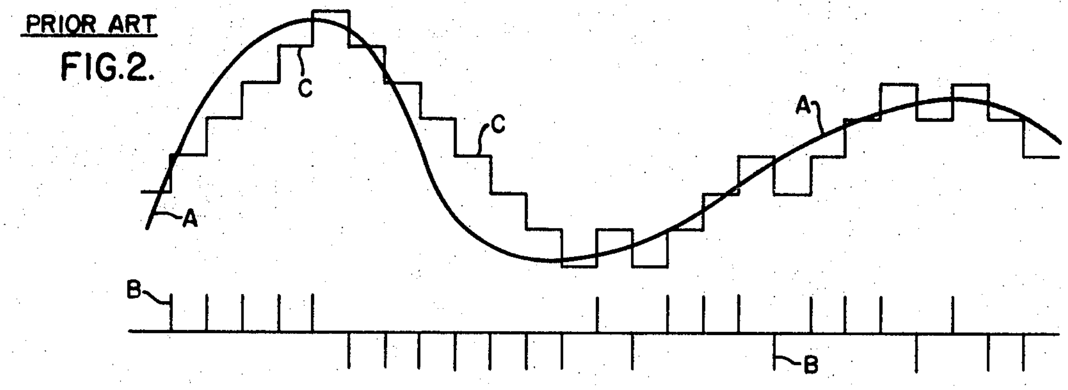
FIG. 2 is a graphical representation of delta modulation waveforms in accordance with the prior art.

A delta modulation system in accordance with the prior art is illustrated in FIGS. 1 and 2. The system includes an encoder 2 which transmits an absolute signal amplitude pulse at a predetermined rate to a decoder 4. A comparator or difference circuit 6 compares the analogue input signal A with an integrated copy of the digital approximation transmitted by the modulator 8. That is, the modulator 8 transmits digital pulses determined by sampling the analogue input signal A at a rate established by clock pulses from a clock 10. At the same time the digital output from the modulator is integrated by a demodulator 12 and returned to the difference circuit 6 to be compared with the analogue input signal. Depending upon which is larger, the sign of the difference from the comparator 6 determined whether a positive pulse or a negative pulse is emitted by the modulator 8. The output pulses which are a digital approximation of the analogue input signal A are transmitted and also demodulated by the simple integrator 12 to provide the next reference signal to the difference circuit 6.

At the receiver end, the decoder 4 demodulates the received pulses by integrating them in a manner similar to the demodulator 12 to thereby obtain the original a analogue input waveform.

FIG. 2 illustrates the operation of the prior art circuit shown in FIG. 1. The analogue input signal A to be approximated in digital form by means of transmitted fixed pulses B is compared with an integrated copy C of the analogue signal A in an attempt to match as closely as possible the integrated copy C as a reference to the analogue signal A sought to be transmitted.

The step size or amplitude of the output pulse B and the sampling rate are selected to best match the spectral characteristics of the input signal to be modulated. Pulse amplitudes cannot be selected too small or the reference C lags the signal A during the higher frequency excursions. Pulse amplitudes cannot be selected too large or the reference C overshoots and oscillates around the signal A during the lower frequency excursions. In each case the quantization noise is high. Experimentally it is possible to find a sampling rate and pulse amplitude which reduces the quantization noise to a minimum but even so the quality of transmission can be objectionable.

The present invention is an improvement upon prior art delta modulation systems. Referring to FIG. 3, an encoder 20 again transmits pulses to a decoder 40, which pulses are a digital approximation of the analogue input signal A. However, the amplitude of the pulses so transmitted is determined by logic circuitry 22. The logic circuitry 22 receives as a first signal thereto the output from a difference circuit 24 which is similar to the difference circuit previously described in FIG. 1. The first signal has a polarity or sign indicative of the difference between the analogue input signal A and an integrated copy D of the digital approximation of the analogue input signal A through demodulator 30. The digital approximation is illustrated by the output of pulses E in FIG. 4.

At the same time, the direction of the analogue input signal A is determined by a differentiator 26. The output of the differentiator 26 provides a second signal to the logic circuitry 22, the polarity or sign of which signal will indicate whether the input signal A is increasing or decreasing in magnitude.

By comparing the sign of the first and second signals at sampling times determined by the clock 32 the logic circuitry 22 is able to determine whether the analogue signal A is moving away from its digital approximation of itself and, if so, control the output of the modulator 28 to transmit a pulse of increased amplitude; for example, twice the amplitude of the usual transmitted pulse or even a pair of pulses of proper polarity. A double frequency shift keying arrangement may also be used, if desirable, by selecting one of four frequencies to better follow excursions in the analogue input signal A. The objective here is to increase the output pulse magnitude if the first signal and the second signal to the logic circuit indicates that the analogue signal A is moving away from the reference D. Otherwise, the output pulse amplitude would be a single unit of the correct polarity.

Figure 4:
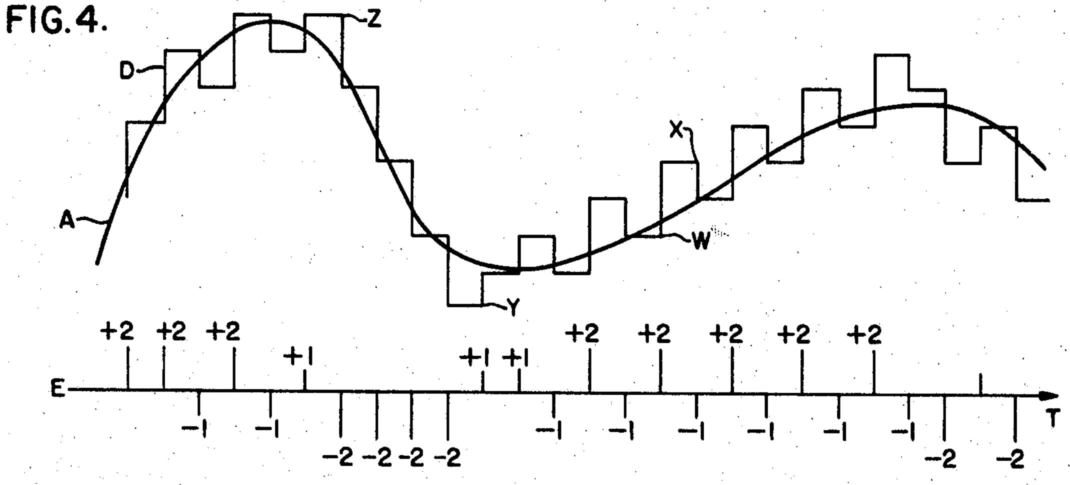
FIG. 4 is a graphical representation of waveforms useful in understanding the operation of the illustrative embodiment shown in FIG. 3.
Figures 5, 6:
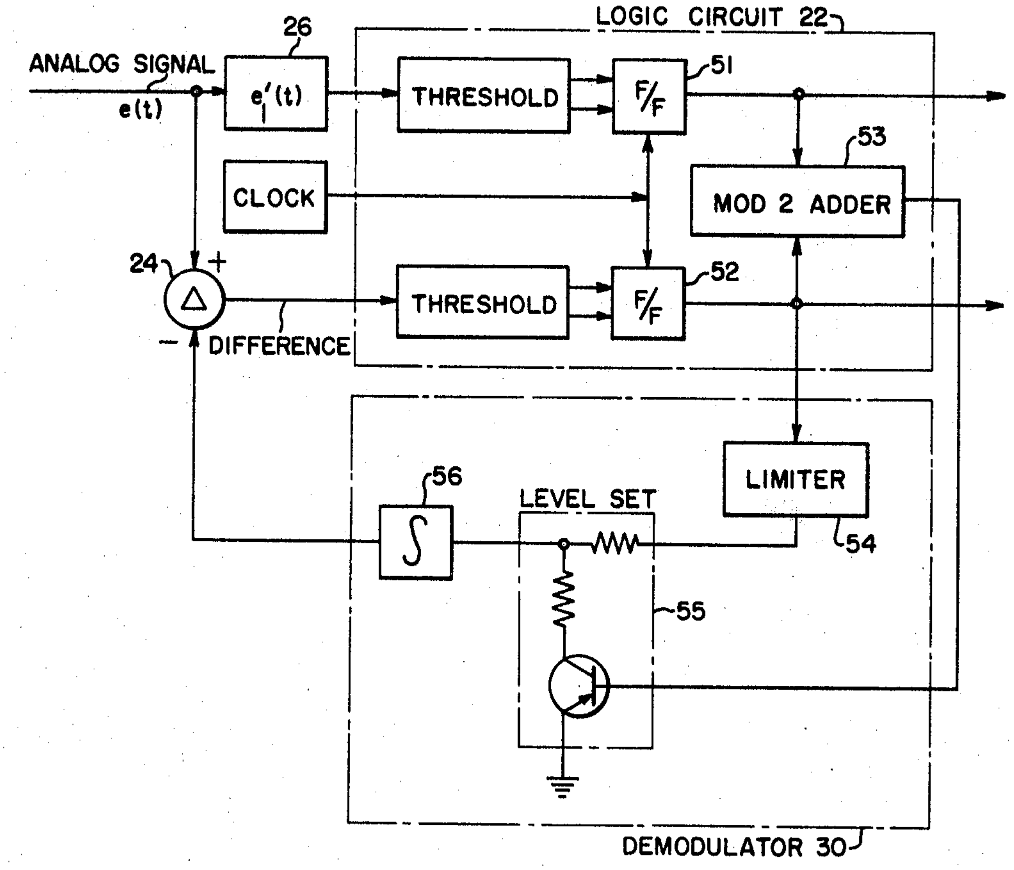
FIG. 5 is a tabulation of the logic scheme utilized in the present invention.
FIG. 6 is a more complete schematic block diagram of an illustrative embodiment of the logic scheme tabulated in FIG. 5.

FIG. 5 shows the logic scheme provided by the circuitry 22. If the analogue input signal A is increasing while at the same time it is greater than the integrated reference D, as for example at point W is FIG. 4, a positive output pulse of twice the size of a unit pulse, as indicated by a 2 over the pulse, will be transmitted by the modulator 28.

If at the instant X in FIG. 4 the input signal A is increasing but the integrated reference D is greater than the input signal A then the sign of the first signal from the difference circuit 24 to the logic circuitry 22 will be negative while the sign of the second signal from the differentiator 26 to the logic circuitry 22 remains positive, the logic circuitry 22 will key the modulator 28 to transmit an output pulse of negative polarity of sign but of only a single unit amplitude.

When the input signal A is found to be decreasing by the differentiator 26 while at the same time the input signal A is greater than the integrated reference D as determined by the difference circuit 24 such as at point Y, the logic circuitry 22 will key the modulator 28 to transmit an output pulse still of unit amplitude but of positive polarity or sign.

If, however, the analogue input signal A is found to be decreasing while at the same time the integrated reference D is greater than the analogue signal A, as for example illustrated at point Z in FIG. 4, the logic circuitry 22 will key the modulator 28 to transmit an output pulse of double unit amplitude and of a negative polarity or sign.

In such a manner then the magnitude of the output pulse is increased if the signals to the logic circuitry 22 indicate that the input signal is moving away from the reference. Otherwise the amplitude of the output pulse from the modulator 28 will be a single unit with the correct polarity or sign.

At the receiver end a demodulator of the decoder 40 provides a simulation of the original input waveform.

Figure 3:
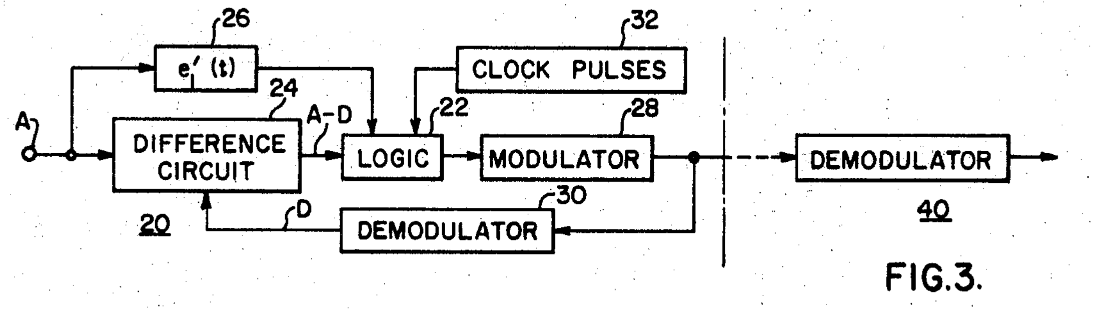
FIG. 3 is a general schematic block diagram of an illustrative embodiment of the present invention.

It should be apparent from the logic table presented in FIG. 5 that the logic circuitry 22 is readily provided by flip-flops 51 and 52 and a mod 2 adder 53 connected in a manner illustrated in FIG. 6 and which is a more detailed version of FIG. 3. The outputs of the flip-flops 51 and 52 are determined by the signs (+,—) of the inputs $e'(t)$ and Δ in the following manner, $$\text{FLIP-FLOP } 51 = 1 \text{ if } e'(t) < 0$$

$$= 0 \text{ if } e'(t) > 0$$

$$\text{FLIP-FLOP } 52 = 1 \text{ if } \Delta < 0$$

$$= 0 \text{ if } \Delta > 0$$

The output of the mod 2 adder 53 in conjunction with the limiter 54 and level set 55 determines the polarity and level of the input from the integrator 56 in accordance with the following table:

| Mod 2 adder | | | Integrator input | |
|---|---|---|---|---|
| Inputs | | | | |
| FF51 | FF52 | Outputs | Polarity | Level |
| 0 | 0 | 0 | — | 2 |
| 0 | 1 | 1 | + | 1 |
| 1 | 0 | 1 | — | 1 |
| 1 | 1 | 0 | + | 2 |

Relating the above table to FIG. 5 we have that FF51 corresponds to A, FF52 corresponds to A-D and the polarity and level corresponds to E.

The method and apparatus of the present invention provide an additional degree of freedom in matching the reference signal D to the signal A to be modulated. The ability to choose between two amplitudes allows some freedom in selecting the best combination of sampling the frequency from the clock 32 and pulse amplitude to better match the frequency characteristics and dynamic range of the input signal.

While the present invention has been described with a degree of particularity to the purposes of illustration, it is to be understood that all modifications alterations and substitutions within the spirit and scope of the present invention are herein meant to be included. For example, while an output pulse of double unit amplitude has been disclosed for the purpose of illustration, it is to be understood that an increase amplitude pulse of any suitable size may be utilized. Further, a double frequency shift key scheme could be utilized as the output from the modulator 28 with a selected one of four frequencies transmitting the desired information in accordance with the four difference amplitudes and signs tabulated in the logic scheme illustrated in FIG. 5.

I claim:

1. In the method of delta modulation wherein a digital approximation to the analogue input signal is transmitted and an integrated copy thereof is compared with the original analogue input signal to determine the difference therebetween, the improvement comprising the steps of; comparing the direction of the analogue signal with the difference between said analogue signal and the integrated copy of the digital approximation thereof to determine whether the analogue signal is moving away from said digital approximation; and increasing the magnitude of said transmitted digital approximation when the analogue signal is moving away from said digital approximation.

2. The improved method of claim 1 including differentiating the analogue input signal to determine the direction of the analogue signal prior to the step of comparing.

3. In the method of claim 1 wherein the magnitude of said digital approximation to be transmitted is doubled when the analogue signal is moving away from said digital approximation.

4. In a delta modulation system wherein a digital approximation to the analogue input signal is transmitted and an integrated copy thereof is compared with the original analogue signal to provide a first signal, the sign of which is indicative of the greater magnitude, the improvement comprising; means for differentiating the analogue signal to provide a second signal, the sign of which indicates the direction of said analogue input signal; and means for increasing the magnitude of said digital approximation to be transmitted when the sign of said first and second signals are alike.

5. The apparatus of claim 4 wherein said last-mentioned means transmits a digital approximation of predetermined amplitude when the first and second signals are different in sign and transmits a digital approximation of magnitude greater than said predetermined magnitude when said first and second signals are alike in sign.

6. The apparatus of claim 5 wherein said output signal is doubled in magnitude when the first and second signals are alike in sign.

7. The apparatus of claim 4 wherein said last mentioned means includes logic circuitry for receiving said first signal and said second signal as inputs thereto and a modulator responsive to the output from said logic circuitry for transmitting pulses of fixed amplitude digitally approximating the analogue input signal when the sign of the first signal is opposite the sign of the second signal and increasing the amplitude of said pulses when the sign of the first signal and the second signal are alike.

8. The apparatus of claim 7 including clock pulsing means for enabling the logic circuitry modulator to sample the first signal and the second signal at a constant rate.

9. The apparatus of claim 4 including a modulator for transmitting pulses of magnitude and polarity which are a digital approximation of the analogue input signal as determined by the sign of the first signal and the second signal.

10. The apparatus of claim 9 wherein the magnitude and sign of the output pulses from the modulator are a function of the direction of the analogue signal and the difference between the analogue signal and an integrated copy thereof.

11. The apparatus of claim 4 wherein said last mentioned means includes logic circuitry for receiving said first signal and said second signal as inputs thereto.

12. The apparatus of claim 11 including means for comparing said original analogue signal with said integrated copy thereof and wherein said logic circuitry is connected to said comparing means and to said differentiating means.